(12) United States Patent
Lin et al.

(10) Patent No.: US 7,583,166 B2
(45) Date of Patent: Sep. 1, 2009

(54) INDUCTOR Q FACTOR ENHANCEMENT APPARATUS HAS BIAS CIRCUIT THAT IS COUPLED TO NEGATIVE RESISTANCE GENERATOR FOR PROVIDING BIAS SIGNAL

(75) Inventors: Ying-Yao Lin, Hsin-Chu Hsien (TW); Ying-Hsi Lin, Hsin-Chu (TW)

(73) Assignee: Realtek Semiconductor Corp., HsinChu (TW)

( * ) Notice: Subject to any disclaimer, the term of this patent is extended or adjusted under 35 U.S.C. 154(b) by 253 days.

(21) Appl. No.: 11/462,997

(22) Filed: Aug. 7, 2006

(65) Prior Publication Data
US 2007/0030103 A1  Feb. 8, 2007

(30) Foreign Application Priority Data
Aug. 8, 2005  (TW) .............................. 94126822 A

(51) Int. Cl.
| | |
|---|---|
| H03H 11/00 | (2006.01) |
| H03M 1/12 | (2006.01) |
| G06G 7/12 | (2006.01) |
| G11C 27/02 | (2006.01) |
| H03K 5/00 | (2006.01) |
| G06F 7/64 | (2006.01) |
| G06G 7/18 | (2006.01) |
| G06G 7/19 | (2006.01) |
| H03B 1/00 | (2006.01) |
| H04B 1/10 | (2006.01) |
| H03F 1/02 | (2006.01) |
| H03G 3/12 | (2006.01) |
| H03F 3/45 | (2006.01) |
| H01F 29/04 | (2006.01) |
| G05F 1/14 | (2006.01) |
| H03J 3/20 | (2006.01) |

(52) U.S. Cl. .................. 333/213; 341/172; 327/362; 327/94; 327/337; 327/554; 330/9; 330/283; 330/254; 331/117; 323/340; 323/255; 334/71; 257/E47.001

(58) Field of Classification Search ................. 331/115, 331/186, 132, 117; 341/172; 327/362, 94, 327/337, 554; 330/9, 283, 254; 323/340, 323/255; 334/71; 333/213–217; 257/E47.001
See application file for complete search history.

(56) References Cited

U.S. PATENT DOCUMENTS

| 4,695,792 | A | * | 9/1987 | Roy ......................... 324/76.82 |
| 5,635,892 | A |   | 6/1997 | Ashby et al. |
| 6,509,790 | B1 | * | 1/2003 | Yang ........................... 327/554 |
| 6,737,944 | B2 |   | 5/2004 | Kunikiyo |
| 2002/0050861 | A1 | * | 5/2002 | Nguyen et al. ............... 330/254 |
| 2006/0017515 | A1 | * | 1/2006 | Stanic et al. ............. 331/117 R |

OTHER PUBLICATIONS

A 5-GHz CMOS Wireless LAN Receiver Front End IEEE Journal of Solid-State Circuits, vol. 35, No. 5, May 2000.

* cited by examiner

Primary Examiner—Phat X Cao
Assistant Examiner—Diana C Garrity
(74) Attorney, Agent, or Firm—Winston Hsu

(57) ABSTRACT

The present invention provides an apparatus for enhancing Q factor of an inductor. The apparatus includes a negative resistance generator coupled to the inductor for providing a negative resistance, and a bias circuit coupled to the negative resistance generator for biasing the negative resistance generator.

12 Claims, 6 Drawing Sheets

INDUCTOR Q FACTOR ENHANCEMENT APPARATUS HAS BIAS CIRCUIT THAT IS COUPLED TO NEGATIVE RESISTANCE GENERATOR FOR PROVIDING BIAS SIGNAL

BACKGROUND OF THE INVENTION

1. Field of the Invention

The present invention relates to a circuit, especially to a circuit capable of enhancing the Q factor of an inductor.

2. Description of the Prior Art

A typical inductor in an analog circuit is usually a planar inductor having a Q factor of approximately 3~8. This low Q factor often limits the application of an inductor. For example, when an inductor is utilized as a load of an amplifier, the gain of the amplifier is proportional to the square of the inductor's Q factor. Therefore, a low Q factor implies a low gain. Moreover, in some narrow-band communication systems, an inductor with high Q factor is utilized for making a narrow-band resonant chamber capable of filtering out interfering signals. The 3 dB bandwidth of the resonant chamber is inversely proportional to the Q factor of the inductor. Therefore, an inductor with a higher Q factor leads to a narrower-band resonant chamber.

Some methods for enhancing the Q factor of an inductor are proposed, such as removing the substrate underneath the inductor to reduce power consumption of the substrate, inserting an isolation metal layer between the inductor and the substrate to reduce power consumption due to a vortex current, and substituting aluminum with high conductance metal (e.g., silver). However, these methods have a significant common drawback of being incompatible with the standard CMOS manufacturing methods. In addition to the methods mentioned above, an inductor can also be implemented by active circuit. However, the noise and linearity of an active circuit limits its application while being utilized in high-frequency and low-noise circuits.

SUMMARY OF THE INVENTION

Therefore, it is one of objectives of the claimed invention to provide an apparatus for enhancing the Q factor of an inductor to solve the above-mentioned problems.

It is one of objectives of the claimed invention to provide an apparatus for enhancing the Q factor of an inductor. The apparatus is coupled to the inductor to eliminate power consumption of the inductor such that the Q factor of the inductor can be enhanced.

It is one of objectives of the claimed invention to provide an apparatus for enhancing the Q factor of an inductor. The apparatus is compatible with the standard manufacturing process of CMOS.

It is one of objectives of the claimed invention to provide an apparatus for enhancing the Q factor of an inductor. The apparatus does not affect the linearity and low noise performance of the inductor.

It is one of objectives of the claimed invention to provide an apparatus for enhancing the Q factor of an inductor. The Q factor of the inductor, which is enhanced by the apparatus, will not change in accordance with voltage, temperature, or manufacturing parameters.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
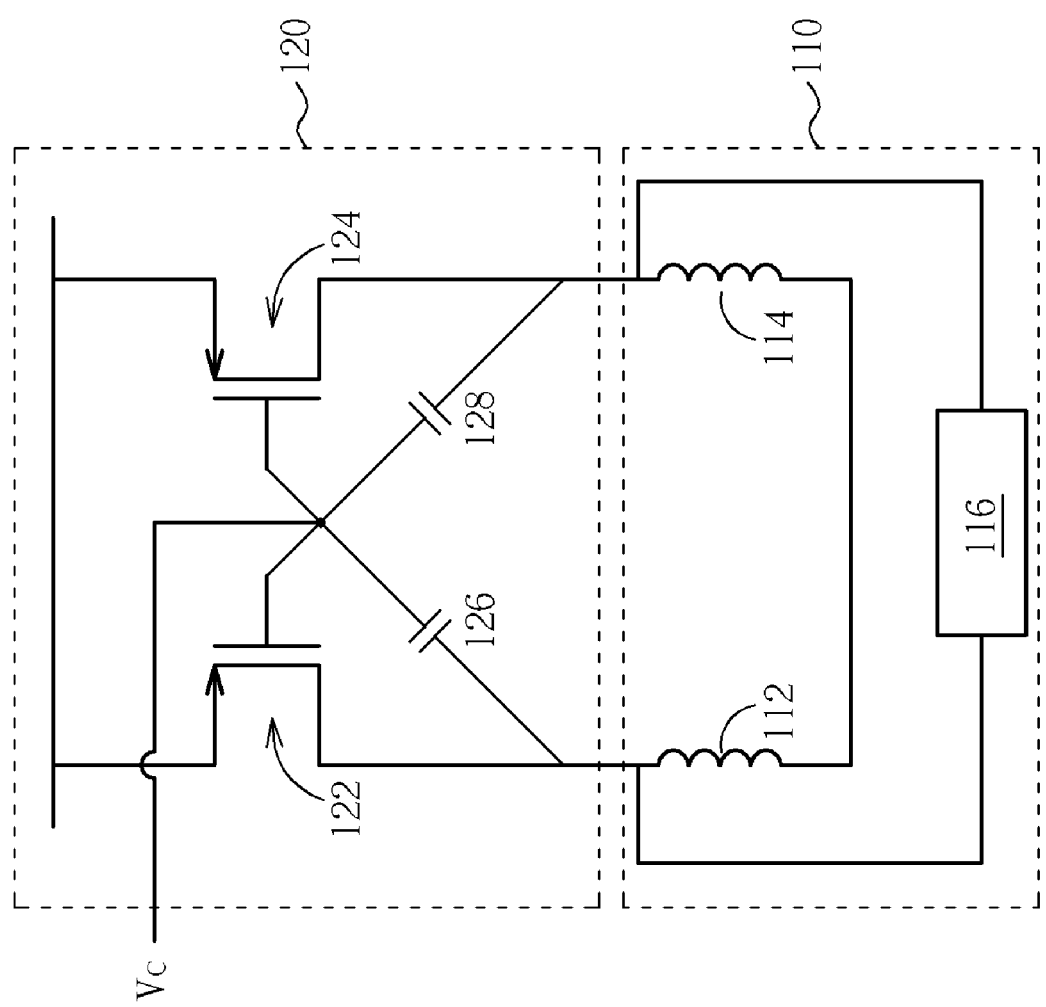
FIG. 1 is the circuit configuration of the present invention illustrating a negative resistance generator compensating for the parasitical resistors of the inductor.
Figure 2:
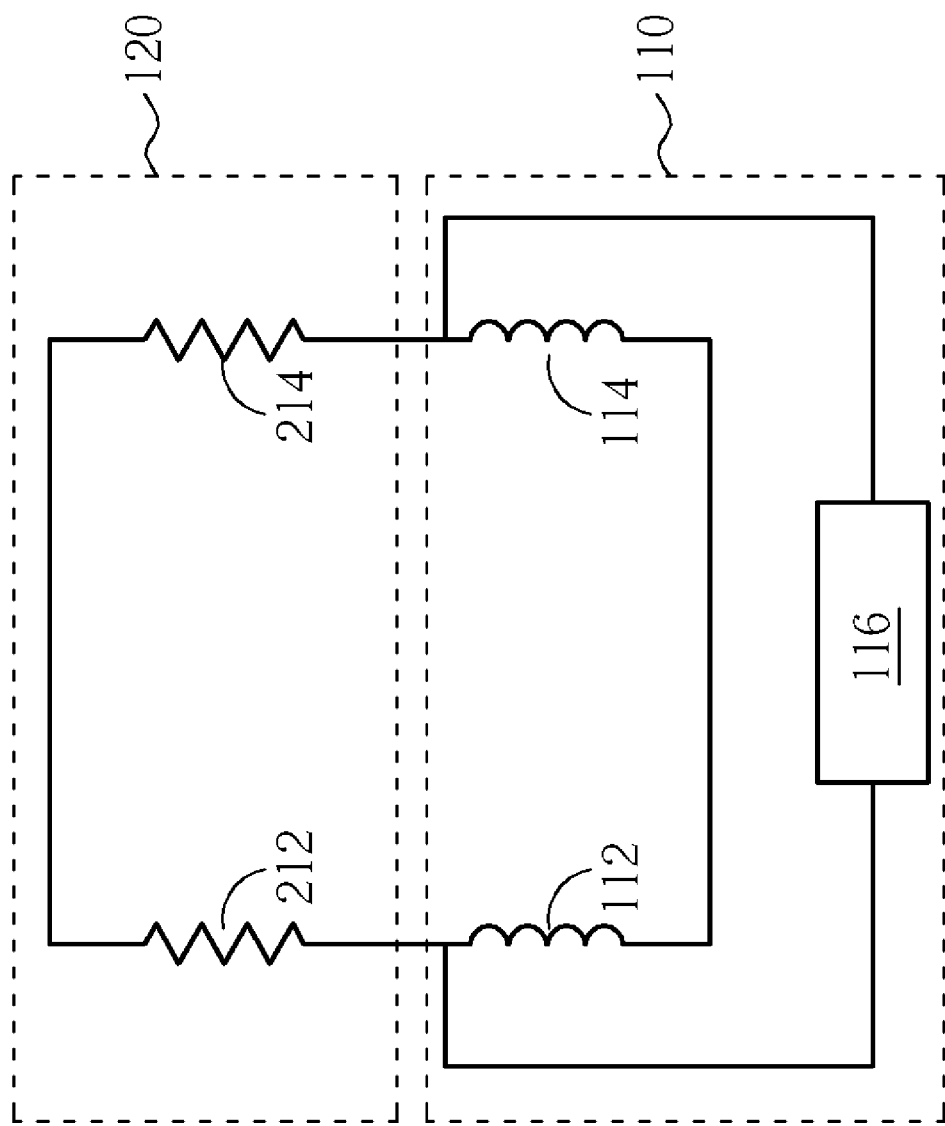
FIG. 2 is an equivalent circuit of the circuit shown in FIG. 1.

One method to enhance the Q factor of a chip inductor is reducing the power consumption of the chip inductor due to its parasitical resistor. The present invention adopts a negative resistance generator, which provides negative resistance, to compensate for the parasitical resistor of the chip inductor. Please refer to FIG. 1. FIG. 1 is the circuit configuration of the present invention illustrating a negative resistance generator 120 compensating for the parasitical resistors of inductors 112 and 114. The inductors 112 and 114 together with an operation circuit 116 construct an application circuit 110. The negative resistance generator 120 is coupled to the application circuit 110 to compensate for the parasitical resistors of the inductors 112 and 114. The negative resistance generator 120 comprises a pair of transistors 122 and 124, which couple to each other. In this embodiment, P-MOSFET's serve as exemplary devices for the transistors 122 and 124 for the sake of illustrating the configuration, but are not meant to be a limitation of the present invention. The gates of the transistors 122 and 124 are coupled to each other, and then further coupled to the drain of the transistor 122 through a capacitor 126 and to the drain of the transistor 124 through a capacitor 128. The capacitors 126 and 128 are AC coupled capacitors, utilized for separating DC components and AC components. Moreover, a voltage level Vc is coupled to the gates of the transistors 122 and 124 to bias the negative resistance generator 120. Under the ways of configuration and biasing described above, the negative resistance generator 120 can be regarded effectively as two resistors coupled in series. Thus, FIG. 1 is simplified to an equivalent circuit shown in FIG. 2. If the manufacturing parameters are the same for both transistors 122 and 124, then in this embodiment, the resistances of the equivalent resistors 212 and 214 shown in FIG. 2 are approximately $-1/gm$, where gm is the transconductance of the transistors 122 and 124.

Figure 3:
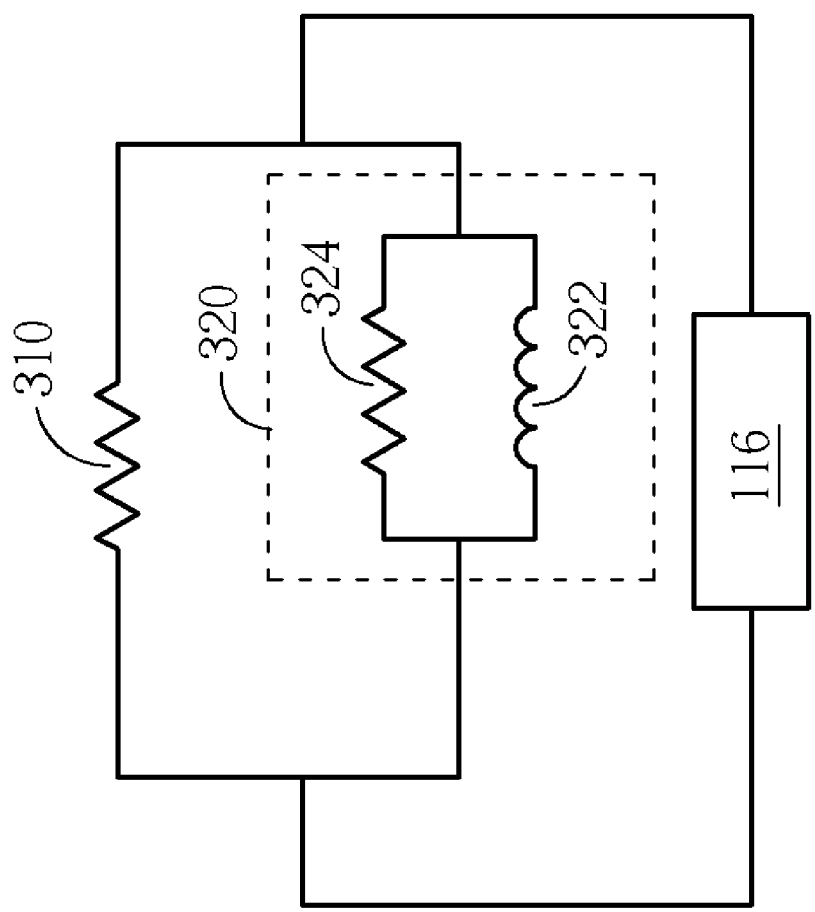
FIG. 3 is an equivalent circuit of the circuit shown in FIG. 2.

The connection among resistors 212, 214, and inductors 112, 114 can be further simplified to an equivalent circuit shown in FIG. 3. The resistor 310 is equivalent to the serial-coupled resistors 212 and 214, and the resistance R− of the resistor 310 is $-2/gm$. The inductor 320 is equivalent to the serial-coupled inductors 112 and 114, and is illustrated in FIG. 3 by a parasitical resistor 324 coupled in parallel with a real inductor 322. The resistance of the parasitical resistor 324 is RL, and the inductance of the inductor 322 is L. As shown in FIG. 3, it is well known to those skilled in the art that the Q factor of the inductor 320 is approximately equal to $R_p/\omega L$, where, $R_p$ is a resistance of the parallel-coupled resistors R− and $R_L$, and $\omega$ is an angular frequency of inductors 112 and 114. Therefore, by properly biasing the negative resistance generator 120 and determining the resistance R− of the resistor 310, the parasitical resistor 324 of the inductor 320 can be compensated and therefore the Q factor of the inductor is enhanced.

Figure 4:
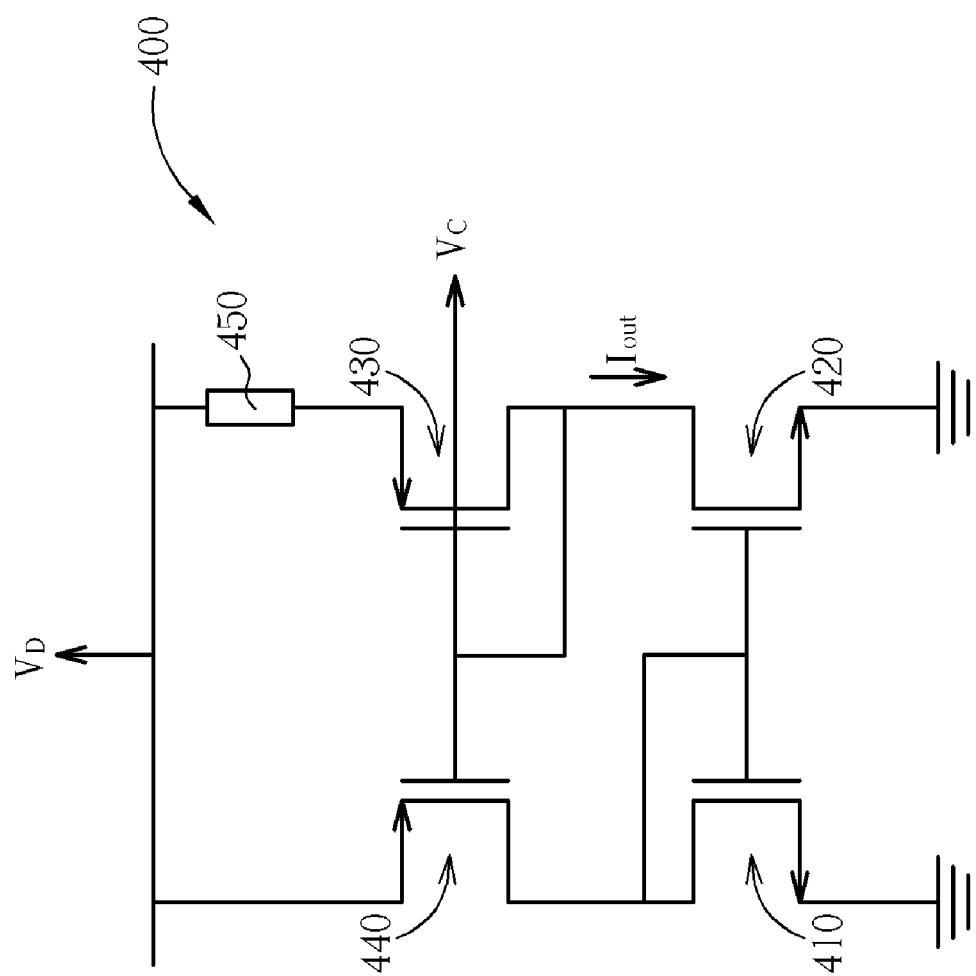
FIG. 4 shows the constant transconductance bias circuit according to an embodiment of the present invention.

In the above-mentioned embodiment, the voltage level Vc, which is utilized to bias the negative resistance generator 120, is provided by a bias circuit. Please refer to FIG. 4. FIG. 4 shows the bias circuit 400 according to an embodiment of the present invention. The bias circuit 400 is a constant transconductance bias circuit. The bias circuit 400 comprises four transistors 410, 420, 430, 440 and a load unit 450. In this embodiment, two P-MOSFET's and two N-MOSFET's serve as exemplary devices for the transistors 410, 420, 430, and 440 for the sake of illustrating the configuration, but are not meant to be a limitation of the present invention. In FIG. 4, assuming that the sizes of the transistors 410, 420, 430, 440 are respectively $(W/L)_N$, $(W/L)_N$, $K(W/L)_P$, $(W/L)_P$ (K is the ratio of the size of the transistor 430 to the size of the transistor 440), and the load unit 450 is a resistor with resistance Rs, then the output current $I_{OUT}$ of the bias circuit 400 is represented as $$I_{OUT} = \frac{2}{\mu_p C_{ox}(W/L)_p} \frac{1}{R_s^2}\left(1 - \frac{1}{\sqrt{K}}\right)^2 \quad \text{Eq. (1)}$$

Since the transistors 122 and 124 are biased by the bias circuit 400, the transconductance gm of the transistors 122 and 124 is $$gm = \sqrt{2\mu_p C_{ox}(W/L)_p I_{OUT}} = \frac{2}{R_s}\left(1 - \frac{1}{\sqrt{K}}\right) \quad \text{Eq. (2)}$$

Thus, the resistance R− of the resistor 310 shown in FIG. 3 is $$R_- = -\frac{2}{gm} = \frac{-R_s}{\left(1 - \frac{1}{\sqrt{K}}\right)} \quad \text{Eq. (3)}$$

Figure 5:
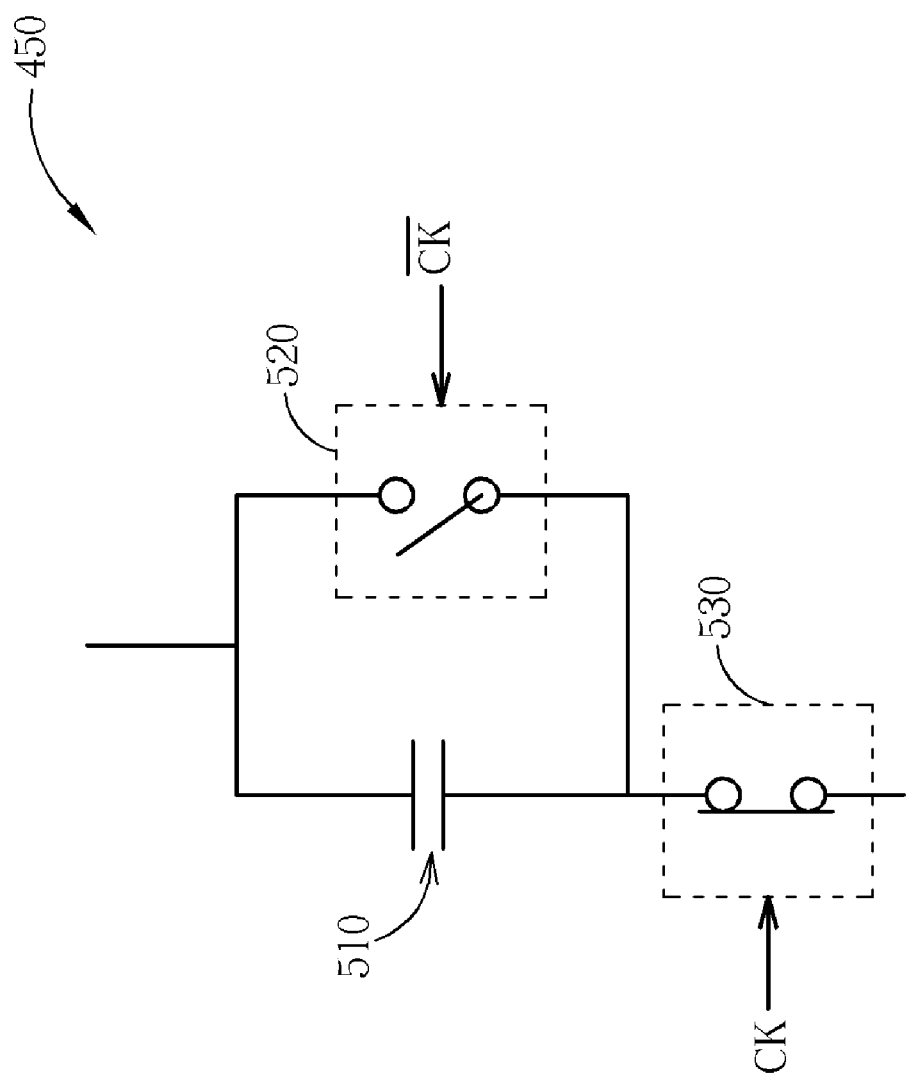
FIG. 5 shows a circuitry which implements the load unit shown in FIG. 4 based on the switched capacitor technique.

Because the resistor $R_s$ is subject to the manufacturing process, the resistance R− of the resistor 310 is relatively unstable. In another preferred embodiment, the load unit 450 shown in FIG. 4, which has a resistance of $R_s$, is implemented by an equivalent resistor generated based on a switched capacitor technique. Therefore, a negative resistance, which is more stable and finely adjustable, can be obtained. Please refer FIG. 5. FIG. 5 shows a circuitry which implements the load unit 450 shown in FIG. 4 according to the switched capacitor technique. The switches 520 and 530 are controlled respectively by two different clocks CK, $\overline{CK}$, which have the same frequency but opposite phases. When one of the switches 520 and 530 is conducted, the other is not conducted, i.e., the switches 520 and 530 are controlled respectively by the clocks CK, $\overline{CK}$ and therefore continuously change their states. Assuming that the capacitance of the capacitor 510 is $C_s$, and the period of the clocks CK, $\overline{CK}$ is T, then the equivalent resistance $R_{eq}$ of the load unit 450 shown in FIG. 5 is $R_{eq} = T/C_s$ Eq. (4)

Substituting $R_s$ in Eq. (3) with $R_{eq}$ of Eq. (4), the resistance R− becomes $$R_- = \frac{-T}{C_s\left(1 - \frac{1}{\sqrt{K}}\right)} \quad \text{Eq. (5)}$$

As a result, the resistance R− of the resistor 310 is determined by the precise timing period T, the ratio K, and the capacitance CS. Therefore, a negative resistance that is more precise and easily adjustable can be obtained.

Figure 6:
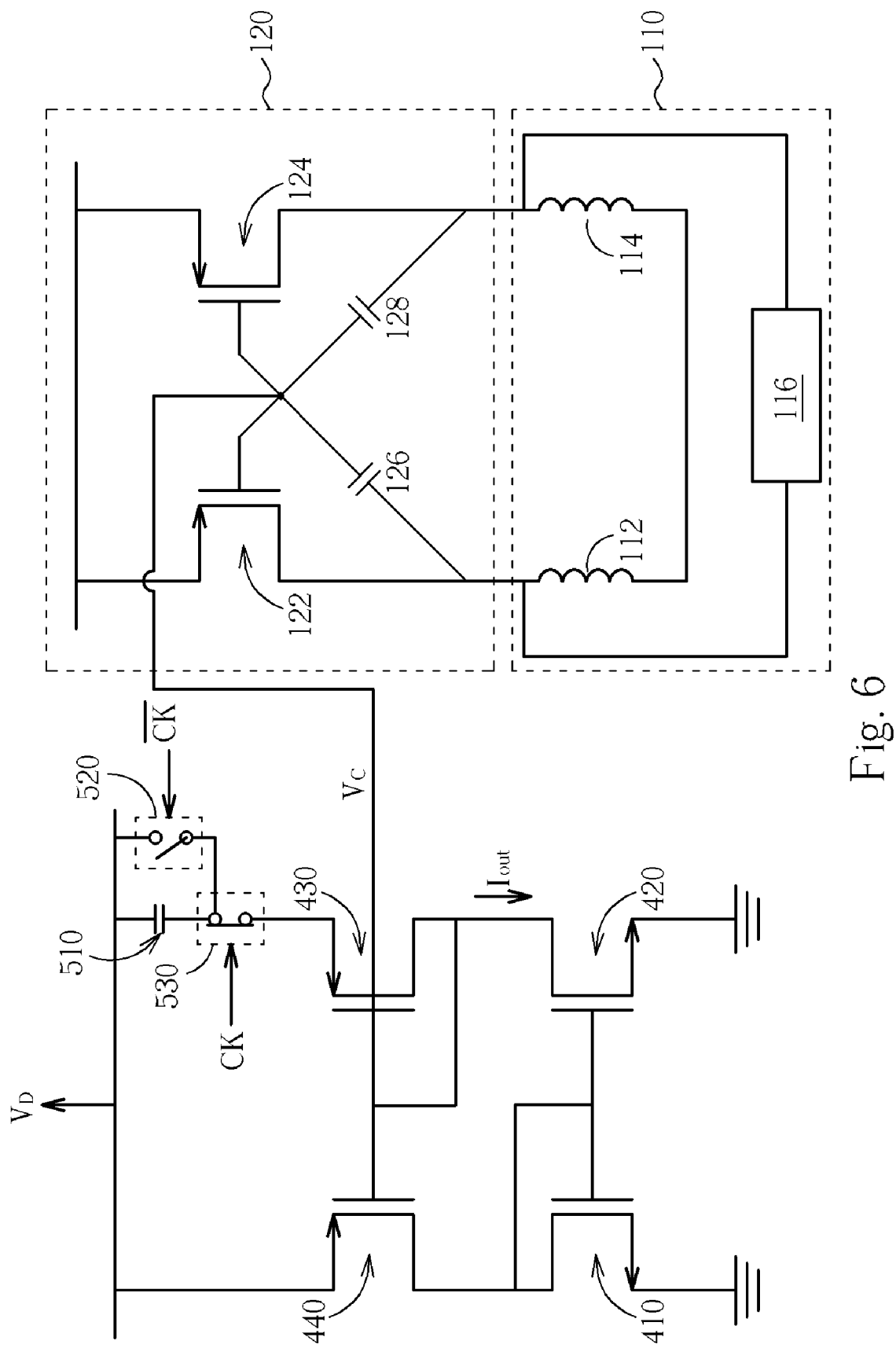
FIG. 6 shows a circuit according to an embodiment of the present invention where a constant transconductance bias circuit, which adopts the switched capacitor technique, is utilized to bias the negative resistance generator.

Please refer to FIG. 1 and FIG. 6 together. FIG. 6 shows a circuit according to an embodiment of the present invention where a constant transconductance bias circuit, which adopts the switched capacitor technique, is utilized to bias the negative resistance generator. As shown in this embodiment, the original inductors are coupled to the circuit of the present invention such that the power consumption of the inductors is reduced and therefore the Q factor is enhanced. In addition, this circuit is compatible with the standard CMOS manufacturing methods, and this circuit will not affect the linearity and low noise performance of the inductor. The Q factor of the inductor will not change in accordance with voltage, temperature, or manufacturing parameters.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An apparatus for adjusting a resistance value of a device, comprising:
    a negative resistance generator, coupled to the device, configured to provide a negative resistance to the device, and
    a constant transconductance bias circuit, coupled to a node of the negative resistance generator, configured to provide a constant transconductance bias signal to the node to bias the negative resistance generator;
    wherein the constant transconductance bias circuit comprises a load unit controlled by a clock signal; and the constant transconductance bias signal is corresponding to a period of the clock signal.

2. The apparatus of claim 1, wherein the negative resistance generator comprises:
    a first transistor, wherein the gate of the first is directly coupled to the node to receive the constant transconductance bias signal;
    a second transistor, wherein the gate of the second transistor is directly coupled to receive the constant transconductance bias signal;
    a first capacitor directly coupled between the drain of the first transistor and the gate of the first transistor; and
    a second capacitor directly coupled between the drain of the second transistor and the gate of the second transistor.

3. The apparatus of claim 1, wherein the negative resistance is configured to change the resistance value of the device such that a power consumption of the inductor is reduced.

4. The apparatus of claim 1, wherein the constant transconductance bias circuit comprises:
    a pair of first transistor coupled to the load unit; and
    a pair of second transistor coupled between the pair of the first transistor and a supply voltage.

5. The apparatus of claim 1, wherein the pair of the first transistor are formed by PMOS transistors, and the pair of the second transistor are formed by NMOS transistors.

6. The apparatus of claim 1, wherein the load unit comprises:
   a capacitor;
   a first switch coupled to the capacitor in series and controlled by the clock signal; and
   a second switch coupled to the capacitor in parallel and controlled by a inverse clock signal.

7. An apparatus for enhancing the Q factor of an inductor, comprising:
   a negative resistance generator, coupled to the inductor, configured to provide a negative resistance to the inductor; and
   a constant transconductance bias circuit, coupled to a node of the negative resistance generator, configured to provide a constant transconductance bias signal to the node to bias the negative resistance generator;
   wherein the constant transconductance bias circuit comprises a load unit controlled by a clock signal; and the constant transconductance bias signal is corresponding to a period of the clock signal.

8. The apparatus of claim 7, wherein the negative resistance generator comprises:
   a first transistor, wherein the gate of the first is directly coupled to the node to receive the constant transconductance bias signal;
   a second transistor, wherein the gate of the second transistor is directly coupled to receive the constant transconductance bias signal;
   a first capacitor directly coupled between the drain of the first transistor and the gate of the first transistor; and
   a second capacitor directly coupled between the drain of the second transistor and the gate of the second transistor.

9. The apparatus of claim 7, wherein the negative resistance is configured to change a resistance value of the inductor such that a power consumption of the inductor is reduced.

10. The apparatus of claim 7, wherein the constant transconductance bias circuit comprises:
    a pair of first transistor coupled to the load unit; and
    a pair of second transistor coupled between the pair of the first transistor and a supply voltage.

11. The apparatus of claim 7, wherein the pair of the first transistor are formed by PMOS transistors, and the pair of the second transistor are formed by NMOS transistors.

12. The apparatus of claim 7, wherein the load unit comprises:
    a capacitor;
    a first switch coupled to the capacitor in series and controlled by the clock signal; and
    a second switch coupled to the capacitor in parallel and controlled by a inverse clock signal.

* * * * *